United States Patent
Min et al.

(10) Patent No.: US 12,410,368 B2
(45) Date of Patent: Sep. 9, 2025

(54) ETCHING GAS COMPOSITION, SUBSTRATE PROCESSING APPARATUS, AND PATTERN FORMING METHOD USING THE ETCHING GAS COMPOSITION

(71) Applicant: SEMES CO., LTD., Chungcheongnam-do (KR)

(72) Inventors: Kyungseok Min, Suwon-si (KR); Sukjune An, Seongnam-si (KR); Donggung Shin, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 117 days.

(21) Appl. No.: 18/336,070

(22) Filed: Jun. 16, 2023

(65) Prior Publication Data
US 2023/0407179 A1 Dec. 21, 2023

(30) Foreign Application Priority Data
Jun. 21, 2022 (KR) .................. 10-2022-0075692

(51) Int. Cl.
*C09K 13/12* (2006.01)

(52) U.S. Cl.
CPC .................. *C09K 13/12* (2013.01)

(58) Field of Classification Search
CPC .................. C09K 13/00; C09K 13/12
See application file for complete search history.

(56) References Cited

U.S. PATENT DOCUMENTS

| | | | |
|---|---|---|---|
| 9,673,058 B1 | 6/2017 | Briggs et al. | |
| 11,075,084 B2 | 7/2021 | Shen | |
| 11,594,429 B2 | 2/2023 | Kanarik | |
| 2017/0365487 A1* | 12/2017 | Shen | C23C 16/56 |
| 2021/0005472 A1* | 1/2021 | Kanarik | H01L 21/67069 |
| 2022/0157600 A1* | 5/2022 | Ashizawa | H01L 21/02192 |
| 2022/0310407 A1* | 9/2022 | Kim | C09K 13/00 |
| 2023/0313039 A1* | 10/2023 | Min | C09K 13/00 438/723 |
| 2023/0386851 A1* | 11/2023 | Suzuki | H01L 21/3065 |

FOREIGN PATENT DOCUMENTS

| | | |
|---|---|---|
| KR | 10-2020-0037402 A | 4/2020 |
| KR | 10-2020-0123481 A | 10/2020 |
| KR | 10-2178834 B1 | 11/2020 |
| KR | 10-2244862 B1 | 4/2021 |
| KR | 10-2244885 B1 | 4/2021 |
| WO | 2022/080267 A1 | 4/2022 |

OTHER PUBLICATIONS

National Library of Medicine, PubChem, "1,1,1,4,4,4 hexafluro-2-butane" via https://pubchem.ncbi.nlm.nih.gov/compound/1_1_1_4_4_4-Hexafluorobut-2-ene (Year: 2025).*
Korean Office Action issued in corresponding KR Patent Application No. 10-2022-0075692, dated Aug. 13, 2024, with English translation.

* cited by examiner

*Primary Examiner* — Binh X Tran
(74) *Attorney, Agent, or Firm* — Carter, DeLuca & Farrell LLP (57) ABSTRACT

An etching gas composition includes at least two $C_3$ or $C_4$ organic fluorine compounds and niobium fluoride, and the at least two $C_3$ or $C_4$ organic fluorine compounds are isomers.

18 Claims, 8 Drawing Sheets

ETCHING GAS COMPOSITION, SUBSTRATE PROCESSING APPARATUS, AND PATTERN FORMING METHOD USING THE ETCHING GAS COMPOSITION

CROSS-REFERENCE TO RELATED APPLICATION

This application is based on and claims priority under 35 U.S.C. § 119 to Korean Patent Application No. 10-2022-0075692, filed on Jun. 21, 2022, in the Korean Intellectual Property Office, the disclosure of which is incorporated by reference herein in its entirety.

BACKGROUND

1. Field

The disclosure relates to an etching gas composition, a substrate processing apparatus, and a pattern forming method using the etching gas composition. More specifically, the disclosure relates to an etching gas composition capable of improving pattern hole distortion according to an etching process and reducing a critical dimension (CD) of a pattern line, a substrate processing apparatus, and a pattern forming method using the etching gas composition.

2. Description of the Related Art

As the electronic industry has developed, the degree of integration of semiconductor devices increases and miniaturization of pattern sizes is continuously required. Accordingly, there is a need for an etching gas composition that has excellent etch selectivity and is capable of improving pattern hole distortion and pattern profile.

SUMMARY

Provided is an etching gas composition that has excellent etch selectivity and is capable of improving pattern hole distortion and pattern profile.

Provided is a substrate processing apparatus that has excellent etch selectivity and is capable of improving pattern hole distortion and pattern profile.

Provided is a pattern forming method that has excellent etch selectivity and is capable of improving pattern hole distortion and pattern profile.

Additional aspects will be set forth in part in the description which follows and, in part, will be apparent from the description, or may be learned by practice of the presented embodiments of the disclosure.

According to an aspect of the disclosure, an etching gas composition includes at least two $C_3$ or $C_4$ organic fluorine compounds and niobium fluoride, wherein the at least two $C_3$ or $C_4$ organic fluorine compounds are isomers.

In an embodiment, the at least two $C_3$ or $C_4$ organic fluorine compounds may each have a formula of $C_3H_2F_6$.

In an embodiment, the at least two $C_3$ or $C_4$ organic fluorine compounds may be selected from among 1,1,1,3,3,3-hexafluoropropane, 1,1,1,2,3,3-hexafluoropropane, and 1,1,2,2,3,3-hexafluoropropane.

In an embodiment, the niobium fluoride may have a formula of $NbF_5$.

In an embodiment, the at least two $C_3$ or $C_4$ organic fluorine compounds may include a first organic fluorine compound and a second organic fluorine compound, the first organic fluorine compound may be 1,1,1,2,3,3-hexafluoropropane, and the second organic fluorine compound may be selected from among 1,1,1,3,3,3-hexafluoropropane and 1,1,2,2,3,3-hexafluoropropane.

In an embodiment, the at least two $C_3$ or $C_4$ organic fluorine compounds may include a first organic fluorine compound and a second organic fluorine compound, the first organic fluorine compound may be 1,1,1,3,3,3-hexafluoropropane, and the second organic fluorine compound may be 1,1,2,2,3,3-hexafluoropropane.

In an embodiment, the niobium fluoride may be included in an amount of about 1 part by volume to about 5 parts by volume based on 100 parts by volume of the etching gas composition.

In an embodiment, the at least two $C_3$ or $C_4$ organic fluorine compounds may each have a formula of $C_4H_2F_6$.

In an embodiment, the at least two $C_3$ or $C_4$ organic fluorine compounds may be selected from among hexafluoroisobutene, (2Z)-1,1,1,4,4,4-hexafluoro-2-butene, 2,3,3,4,4,4-hexafluoro-1-butene, (2Z)-1,1,1,2,4,4-hexafluoro-2-butene, (2Z)-1,1,2,3,4,4-hexafluoro-2-butene, 1,1,2,3,4,4-hexafluoro-2-butene, (3R, 4S)-1,1,2,2,3,4-hexafluorocyclobutane, and 1,1,2,2,3,3-hexafluorocyclobutane.

In an embodiment, the at least two $C_3$ or $C_4$ organic fluorine compounds may include a third organic fluorine compound and a fourth organic fluorine compound, the third organic fluorine compound may be (2Z)-1,1,1,4,4,4-hexafluoro-2-butene, and the fourth organic fluorine compound may be selected from among hexafluoroisobutene and (3R, 4S)-1,1,2,2,3,4-hexafluorocyclobutane.

In an embodiment, the at least two $C_3$ or $C_4$ organic fluorine compounds may include a third organic fluorine compound and a fourth organic fluorine compound, the third organic fluorine compound may be hexafluoroisobutene, and the fourth organic fluorine compound may be (3R, 4S)-1,1,2,2,3,4-hexafluorocyclobutane.

In an embodiment, the etching gas composition may further include an inert gas and a reactive gas, wherein the inert gas may be selected from among argon (Ar), helium (He), neon (Ne), and any mixture thereof.

In an embodiment, the reactive gas may be oxygen gas ($O_2$).

According to another aspect of the disclosure, a substrate processing apparatus includes a chamber having a processing space in which substrate processing is performed, a gas supply device configured to supply an etching gas composition to the processing space, and a substrate support device disposed in the processing space and configured to support a substrate, wherein the etching gas composition includes at least two $C_3$ or $C_4$ organic fluorine compounds and niobium fluoride, and the at least two $C_3$ or $C_4$ organic fluorine compounds are isomers.

The substrate processing apparatus may further include a shower head disposed above the substrate and having a plurality of gas supply holes.

According to another aspect of the disclosure, a pattern forming method includes forming a layer to be etched on a substrate, forming an etching mask on the layer to be etched, etching the layer to be etched through the etching mask by using plasma obtained from an etching gas composition, and removing the etching mask, wherein the etching gas composition includes at least two $C_3$ or $C_4$ organic fluorine compounds and niobium fluoride, and the at least two $C_3$ or $C_4$ organic fluorine compounds are isomers.

In an embodiment, the etching mask may be at least one selected from among a photoresist (PR), a spin-on hardmask (SOH), and an amorphous carbon layer (ACL).

In an embodiment, the layer to be etched may include at least one of silicon nitride or silicon oxide.

In an embodiment, a plasma source for obtaining the plasma may be one of an inductively coupled plasma (ICP) or a capacitively coupled plasma (CCP).

In an embodiment, the niobium fluoride may have a formula of $NbF_5$ and may be included in an amount of about 1 part by volume to about 5 parts by volume based on 100 parts by volume of the etching gas composition.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Embodiments will be described in detail with reference to the accompanying drawings. The same elements in the drawings are denoted by the same reference numerals, and redundant descriptions thereof are omitted.

An etching gas composition according to an embodiment may include at least two $C_3$ or $C_4$ organic fluorine compounds and niobium fluoride, wherein the at least two $C_3$ or $C_4$ organic fluorine compounds may be isomers.

In an embodiment, the at least two $C_3$ or $C_4$ organic fluorine compounds may each have a formula of $C_3H_2F_6$.

In an embodiment, the at least two $C_3$ or $C_4$ organic fluorine compounds may be selected from among 1,1,1,3,3,3-hexafluoropropane, 1,1,1,2,3,3-hexafluoropropane, and 1,1,2,2,3,3-hexafluoropropane.

In an embodiment, the at least two $C_3$ or $C_4$ organic fluorine compounds may include a first organic fluorine compound and a second organic fluorine compound, the first organic fluorine compound may be 1,1,1,2,3,3-hexafluoropropane, and the second organic fluorine compound may be selected from among 1,1,1,3,3,3-hexafluoropropane and 1,1,2,2,3,3-hexafluoropropane. For example, the first organic fluorine compound may be 1,1,1,2,3,3-hexafluoropropane and the second organic fluorine compound may be 1,1,1,3,3,3-hexafluoropropane.

In an embodiment, in the at least two $C_3$ or $C_4$ organic fluorine compounds, a molar ratio of the first organic fluorine compound may be selected within a range of about 60 mol % to about mol %, and a molar ratio of the second organic fluorine compound may be selected within a range of about 15 mol % to about 40 mol %. In an embodiment, in the at least two $C_3$ or $C_4$ organic fluorine compounds, a molar ratio of the first organic fluorine compound may be selected within a range of about 65 mol % to about 85 mol %, and a molar ratio of the second organic fluorine compound may be selected within a range of about 20 mol % to about 30 mol %. In an embodiment, in the at least two $C_3$ or $C_4$ organic fluorine compounds, a molar ratio of the first organic fluorine compound may be selected within a range of about 70 mol % to about 80 mol %, and a molar ratio of the second organic fluorine compound may be selected within a range of about 20 mol % to about 30 mol %. For example, when the first organic fluorine compound is 1,1,1,2,3,3-hexafluoropropane and the second organic fluorine compound is 1,1,1,3,3,3-hexafluoropropane, a molar ratio of the first organic fluorine compound may be about mol % and a molar ratio of the second organic fluorine compound may be about 25 mol %.

When a mixing ratio of the first organic fluorine compound to the second fluorine compound is the same as described above, a desired etch rate and etch selectivity may be obtained. Specifically, for example, in a case where the first organic fluorine compound is 1,1,1,2,3,3-hexafluoropropane and the second organic fluorine compound is 1,1,1,3,3,3-hexafluoropropane, the etch selectivity may decrease when the amount of the first organic fluorine compound is excessively small, and the etch rate may decrease when the amount of the first organic fluorine compound is excessively large.

In an embodiment, the at least two $C_3$ or $C_4$ organic fluorine compounds may include a first organic fluorine compound and a second organic fluorine compound, the first organic fluorine compound may be 1,1,1,3,3,3-hexafluoropropane, and the second organic fluorine compound may be 1,1,2,2,3,3-hexafluoropropane.

In an embodiment, in the at least two $C_3$ or $C_4$ organic fluorine compounds, a molar ratio of the first organic fluorine compound may be selected within a range of about 30 mol % to about 70 mol %, and a molar ratio of the second organic fluorine compound may be selected within a range of about 30 mol % to about 70 mol %. In an embodiment, in the at least two $C_3$ or $C_4$ organic fluorine compounds, a molar ratio of the first organic fluorine compound may be selected within a range of about 40 mol % to about 60 mol %, and a molar ratio of the second organic fluorine compound may be selected within a range of about 40 mol % to about 60 mol %. For example, in the at least two $C_3$ or $C_4$ organic fluorine compounds, a molar ratio of the first organic fluorine compound may be about 50 mol %, and a molar ratio of the second organic fluorine compound may be about 50 mol %.

When a mixing ratio of the first organic fluorine compound to the second fluorine compound is the same as described above, a desired etch rate and etch selectivity may be obtained. Specifically, the etch rate may decrease when the amount of the first organic fluorine compound is excessively small, and the etch selectivity may decrease when the amount of the first organic fluorine compound is excessively large.

In an embodiment, the at least two $C_3$ or $C_4$ organic fluorine compounds may each have a formula of $C_4H_2F_6$.

In an embodiment, the at least two $C_3$ or $C_4$ organic fluorine compounds may be selected from among hexafluoroisobutene, (2Z)-1,1,1,4,4,4-hexafluoro-2-butene, (3R,4S)-1,1,2,2,3,4-hexafluorocyclobutane, 2,3,3,4,4,4- hexafluoro-1-butene, 1,1,2,2,3,3-hexafluorocyclobutane, (2Z)-1,1,1,2,4,4-hexafluoro-2-butene, (2Z)-1,1,2,3,4,4-hexafluoro-2-butene, and 1,1,2,3,4,4-hexafluoro-2-butene.

In an embodiment, at least two $C_3$ or $C_4$ organic fluorine compounds may include a third organic fluorine compound and a fourth organic fluorine compound, the third organic fluorine compound may be (2Z)-1,1,1,4,4,4-hexafluoro-2-butene, and the fourth organic fluorine compound may be selected from among hexafluoroisobutene and (3R, 4S)-1,1,2,2,3,4-hexafluorocyclobutane. For example, the third organic fluorine compound may be (2Z)-1,1,1,4,4,4-hexafluoro-2-butene, and the fourth organic fluorine compound may be (3R, 4S)-1,1,2,2,3,4-hexafluorocyclobutane.

In an embodiment, in the at least two $C_3$ or $C_4$ organic fluorine compounds, a molar ratio of the third organic fluorine compound may be selected within a range of about 60 mol % to about 90 mol %, and a molar ratio of the fourth organic fluorine compound may be selected within a range of about 10 mol % to about 40 mol %. In an embodiment, in the at least two $C_3$ or $C_4$ organic fluorine compounds, a molar ratio of the third organic fluorine compound may be selected within a range of about 65 mol % to about 85 mol %, and a molar ratio of the fourth organic fluorine compound may be selected within a range of about 15 mol % to about 35 mol %. In an embodiment, in the at least two $C_3$ or $C_4$ organic fluorine compounds, a molar ratio of the third organic fluorine compound may be selected within a range of about 70 mol % to about 80 mol %, and a molar ratio of the fourth organic fluorine compound may be selected within a range of about 20 mol % to about 30 mol %. For example, when the third organic fluorine compound is (2Z)-1,1,1,4,4,4-hexafluoro-2-butene and the fourth organic fluorine compound is hexafluoroisobutene, a molar ratio of the third organic fluorine compound may be about 75 mol % and a molar ratio of the fourth organic fluorine compound may be about 25 mol %.

When a mixing ratio of the third organic fluorine compound to the fourth fluorine compound is the same as described above, a desired etch rate and etch selectivity may be obtained. Specifically, for example, in a case where the third organic fluorine compound is (2Z)-1,1,1,4,4,4-hexafluoro-2-butene and the fourth organic fluorine compound is hexafluoroisobutene, the etch selectivity may decrease when the amount of the third organic fluorine compound is excessively small, and the etch rate may decrease when the amount of the third organic fluorine compound is excessively large.

In an embodiment, the at least two $C_3$ or $C_4$ organic fluorine compounds may include a third organic fluorine compound and a fourth organic fluorine compound, the third organic fluorine compound may be hexafluoroisobutene, and the fourth organic fluorine compound may be (3R, 4S)-1,1,2,2,3,4-hexafluorocyclobutane.

In an embodiment, in the at least two $C_3$ or $C_4$ organic fluorine compounds, a molar ratio of the third organic fluorine compound may be selected within a range of about 30 mol % to about 70 mol %, and a molar ratio of the fourth organic fluorine compound may be selected within a range of about 30 mol % to about 70 mol %. In an embodiment, in the at least two $C_3$ or $C_4$ organic fluorine compounds, a molar ratio of the third organic fluorine compound may be selected within a range of about 40 mol % to about 60 mol %, and a molar ratio of the fourth organic fluorine compound may be selected within a range of about 40 mol % to about 60 mol %. For example, in the at least two $C_3$ or $C_4$ organic fluorine compounds, a molar ratio of the third organic fluorine compound may be about 50 mol %, and a molar ratio of the fourth organic fluorine compound may be about 50 mol %.

When a mixing ratio of the third organic fluorine compound to the fourth fluorine compound is the same as described above, a desired etch rate and etch selectivity may be obtained. Specifically, the etch rate may decrease when the amount of the third organic fluorine compound is excessively small, and the etch selectivity may decrease when the amount of the third organic fluorine compound is excessively large.

In an embodiment, the niobium fluoride may have a formula of $NbF_5$.

The niobium fluoride may be included in the etching gas composition at a certain ratio. In an embodiment, the niobium fluoride may be included in an amount of about 1 part by volume to about 5 parts by volume based on 100 parts by volume of the etching gas composition.

Hole distortion may be effectively prevented when the volume ratio of the niobium fluoride to the etching gas composition is the same as described above.

In a process of manufacturing a semiconductor device, an etching gas composition may include various types of fluorine compounds, inert gases, oxygen, and the like. In this case, the amount of oxygen included in the etching gas composition may be adjusted according to an aspect ratio of a pattern to be formed or a type of fluorine compound included in the etching gas composition. For example, an etching gas composition including a fluorine compound that is more likely to be deposited during an etching process may include a larger amount of oxygen than an etching gas composition including a fluorine compound that is less likely to be deposited during an etching process. When a larger amount of oxygen is included, the etch rate of the etching gas composition increases, but the selectivity of the etching gas composition for the etching mask deteriorates, or the profile of the pattern formed by using the etching gas composition deteriorates. On the other hand, the etching gas composition according to an embodiment may include at least two $C_3$ or $C_4$ organic fluorine compounds that are isomers. The etching gas composition may be used to form patterns having various aspect ratios by controlling the ratio of the organic fluorine compounds without adjusting the amount of oxygen. In particular, in forming a pattern having a high aspect ratio, the ratio of the organic fluorine compounds may be controlled without increasing the amount of oxygen included in the etching gas composition, and the pattern having a high aspect ratio may be formed by using the same. Accordingly, the profile of a pattern formed by using the etching gas composition may be improved while maintaining a relatively high selectivity of the etching gas composition.

In addition, in general, hole distortion may occur in the pattern formed by the etching process. The hole distortion refers to a phenomenon in which the bottom surface of the pattern formed by the etching process has a distorted circular shape rather than a circular shape. When hole distortion occurs, electrical characteristics of the hole may deteriorate, and thus, functional reliability of the semiconductor device including the hole may deteriorate. Because the etching gas composition according to an embodiment includes the niobium fluoride, hole distortion of the pattern formed by using the etching gas composition may be improved.

In an embodiment, the etching gas composition may further include an inert gas. The inert gas may be, for example, helium (He), neon (Ne), argon (Ar), xenon (Xe), or any mixture thereof, but the disclosure is not limited thereto.

In an embodiment, the etching gas composition may further include a reactive gas. The reactive gas may be, for example, oxygen ($O_2$), carbon monoxide (CO), carbon dioxide ($CO_2$), nitrogen monoxide (NO), nitrogen dioxide ($NO_2$), nitrous oxide ($N_2O$), hydrogen ($H_2$), ammonia ($NH_3$), hydrogen fluoride (HF), sulfur dioxide ($SO_2$), carbon disulfide ($CS_2$), carbonyl sulfide (COS), $CF_3I$, $C_2F_3I$, $C_2F_5I$, or any mixture thereof, but the disclosure is not limited thereto.

The etching gas composition described above has an excellent etch selectivity of a silicon compound (e.g., silicon oxide and/or silicon nitride) with respect to an amorphous carbon layer (ACL). In particular, because the etching selectivity of $SiO_2$/ACL or $Si_3N_4$/ACL is excellent, $SiO_2$/ACL or $Si_3N_4$/ACL may be excellently used for channel hole etching and cell metal contact (CMC).

Figure 1:
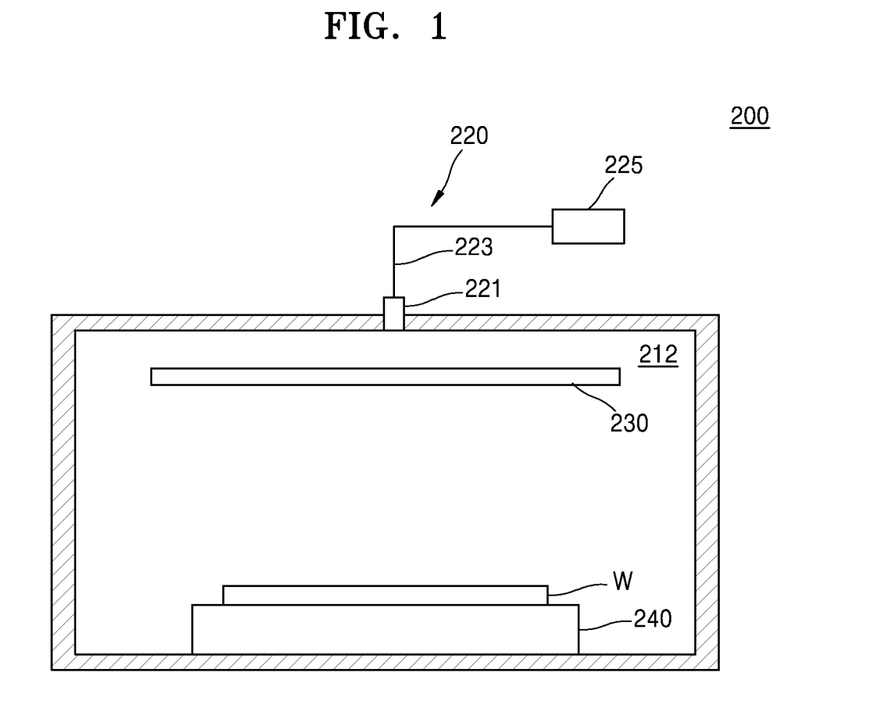
FIG. 1 is a cross-sectional view illustrating a substrate processing apparatus using an etching gas composition, according to an embodiment.

FIG. 1 is a cross-sectional view schematically illustrating a substrate processing apparatus 200 using an etching gas composition, according to an embodiment.

Referring to FIG. 1, the substrate processing apparatus 200 may include a chamber 210, a gas supply device 220, a shower head 230, and a substrate support device 240.

The chamber 210 may have a tubular shape having a space therein. The chamber 210 may have a processing space 212 therein. The shower head 230 and the substrate support device 240 may be located in the processing space 212. The chamber 210 may have a rectangular shape in a front section, but the disclosure is not limited thereto.

The gas supply device 220 may be located on the chamber 210. The gas supply device 220 may supply an etching gas composition according to an embodiment to the processing space 212. The etching gas composition may be changed to a plasma state by a plasma source (not shown).

The gas supply device 220 may include a gas supply nozzle 221, a gas supply line 223, and a gas supply source 225. The gas supply nozzle 221 may be located at the center of the top surface of the chamber 210. The gas supply nozzle 221 may pass through the top surface of the chamber 210 in a vertical direction. A spray hole may be formed in the bottom surface of the gas supply nozzle 221. The gas supply nozzle 221 may supply the etching gas composition to the processing space 212 through the spray hole. The gas supply line 223 may connect the gas supply nozzle 221 and the gas supply source 225 to each other. The gas supply line 223 may supply the etching gas composition supplied from the gas supply source 225 to the gas supply nozzle 221. Although not illustrated in FIG. 1, a valve (not shown) may be disposed on the gas supply line 223. The valve may control the supply of the etching gas composition to the gas supply nozzle 221. For example, when the valve is opened, the etching gas composition may be supplied to the gas supply nozzle 221, and when the valve is closed, the etching gas composition may not be supplied to the gas supply nozzle 221. For example, two or more valves may be provided, but the disclosure is not limited thereto. The gas supply source 225 may supply the etching gas composition to the gas supply nozzle 221 through the gas supply line 223. As an etching process is performed by using the etching gas composition, a profile of a pattern may be improved by reducing a critical dimension (CD) of a pattern line formed by the etching process, and hole distortion of the pattern may be improved.

The plasma source may change the etching gas composition, which is supplied to the processing space 212, to a plasma state. In an embodiment, the plasma source may be an inductively coupled plasma (ICP) or a capacitively coupled plasma (CCP). However, the disclosure is not limited thereto. For example, the plasma source may be a reactive ion etching (RIE) equipment, a magnetically enhanced reactive ion etching (MERIE) equipment, a transformer coupled plasma (TCP) equipment, a hollow anode type plasma equipment, a helical resonator plasma equipment, an electron cyclotron resonance (ECR) plasma equipment, or the like.

The shower head 230 may be disposed in the processing space 212. The shower head 230 may be spaced apart from the top surface of the chamber 210 by a certain distance in a direction toward the substrate support device 240. The shower head 230 may be located above the substrate support device 240 and a substrate W. The shower head 230 may have, for example, a plate shape, but the disclosure is not limited thereto. The cross-sectional area of the shower head 230 may be greater than the cross-sectional area of the substrate support device 240, but the disclosure is not limited thereto. In an embodiment, the bottom surface of the shower head 230 may be anodized in order to prevent an electric arc from occurring due to plasma. The shower head 230 may include a plurality of gas supply holes (not shown). The gas supply holes may pass through the top and bottom surfaces of the shower head 230 in a vertical direction. The etching gas composition, which is supplied by the gas supply device 220 through the gas supply holes, may be supplied to the lower portion of the shower head 230.

The substrate support device 240 may be disposed on the bottom surface of the chamber 210 in the processing space 212. The substrate support device 240 may be, for example, an electrostatic chuck that adsorbs the substrate W by using electrostatic force, but the disclosure is not limited thereto. The substrate support device 240 may support the substrate W. The substrate support device 240 may have, for example, a disk shape, but the disclosure is not limited thereto. The cross-sectional area of the substrate support device 240 may be greater than the cross-sectional area of the substrate W, but the disclosure is not limited thereto.

Although not illustrated in FIG. 1, the substrate processing apparatus 200 may include a controller (not shown). The controller may control the operation of the substrate processing apparatus 200. For example, the controller may be configured to transmit and receive electric signals to and from the gas supply device 220, and may be configured to control the operation of the gas supply device 220 by using the electric signals.

The controller may be implemented as hardware, firmware, software, or any combination thereof. For example, the controller may be a computing device, such as a workstation computer, a desktop computer, a laptop computer, or a tablet computer. For example, the controller may include a memory device or a processor configured to perform certain operations and algorithms. Examples of the memory device may include read-only memory (ROM) and random access memory (RAM), and examples of the processor may include a microprocessor, a central processing unit (CPU), and a graphics processing unit (GPU). In addition, the controller may include a receiver and a transmitter configured to receive and transmit electric signals.

Figure 2:
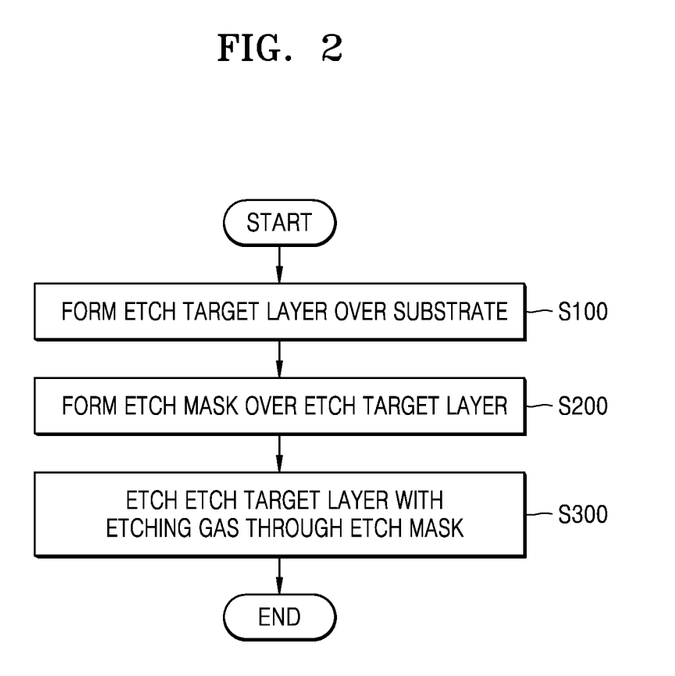
FIG. 2 is a flowchart of a pattern forming method according to an embodiment.

FIG. 2 is a flowchart of a pattern forming method according to an embodiment. FIGS. 3A to 3F are cross-sectional views illustrating the operations of a method of manufacturing a semiconductor device, according to an embodiment.

Figure 3A:
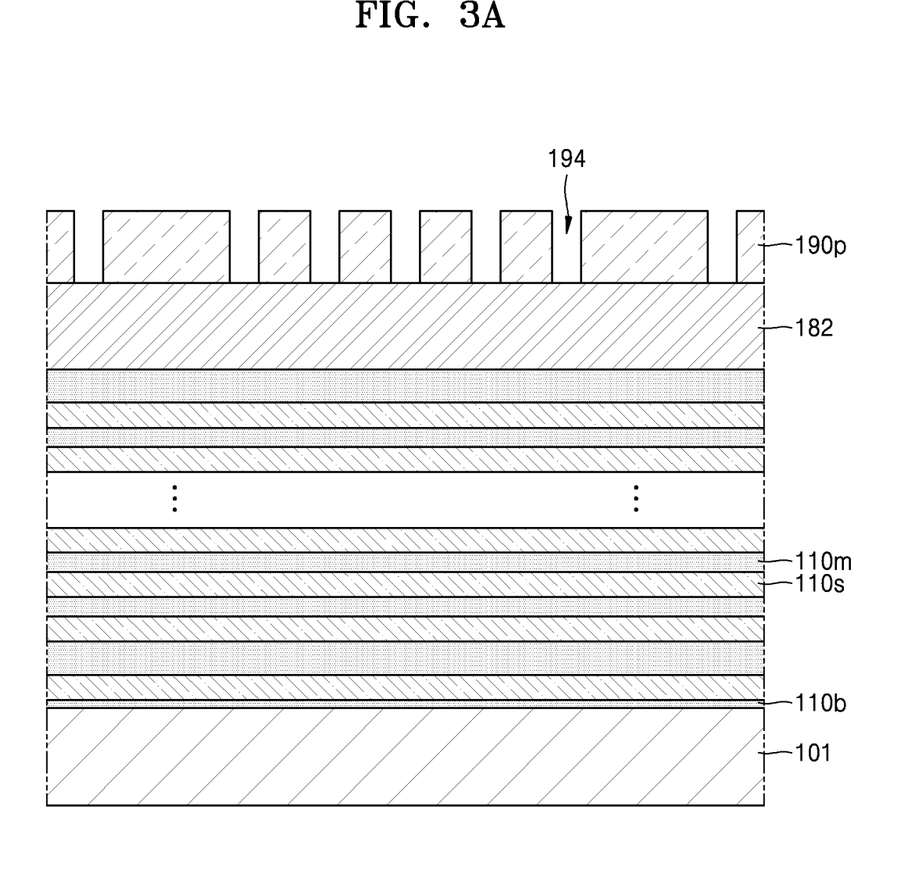
FIGS. 3A to 3F are cross-sectional views illustrating the operations of a method of manufacturing a semiconductor device, according to an embodiment.

Referring to FIGS. 2 and 3A, a layer to be etched may be formed on a substrate 101 by alternately and repeatedly laminating a sacrificial layer 110s and an insulating layer 110m (S100).

The substrate 101 may include a Group IV semiconductor, such as silicon (Si) or germanium (Ge), a Group IV-IV compound semiconductor, such as silicon-germanium (SiGe) or silicon carbide (SiC), or a Group III-V compound semiconductor, such as gallium arsenide (GaAs), indium arsenide (InAs), or indium phosphide (InP). The substrate 101 may be provided as a bulk wafer or an epitaxial layer. In another embodiment, the substrate 101 may include a silicon-on-insulator (SOI) substrate or a germanium-on-insulator (GeOI) substrate. In an embodiment, the substrate 101 may include a first-conductivity-type (e.g., p-type) well.

The sacrificial layer 110s may include a material having an etch selectivity with respect to the insulating layer 110m. For example, the sacrificial layer 110s may be selected to be removed at a higher etch selectivity than the insulating layer 110m in an etching process using an etchant. For example, the insulating layer 110m may include silicon oxide or silicon nitride, and the sacrificial layer 110s may include silicon oxide, silicon nitride, silicon carbide, polysilicon, or silicon germanium. The sacrificial layer 110s may be selected to have a high etch selectivity with respect to the insulating layer 110m. For example, when the sacrificial layer 110s includes silicon oxide, the insulating layer 110m may include silicon nitride. As another example, when the sacrificial layer 110s includes silicon nitride, the insulating layer 110m may include silicon oxide. As another example, when the sacrificial layer 110s includes undoped polysilicon, the insulating layer 110m may include silicon nitride or silicon oxide.

The sacrificial layer 110s and the insulating layer 110m may each be formed by chemical vapor deposition (CVD), physical vapor deposition (PVD), or atomic layer deposition (ALD).

A thermal oxide layer 110b may be formed between the substrate 101 and the sacrificial layer 110s closest to the substrate 101. The thermal oxide layer 110b may be thinner than the insulating layer 110m.

A hard mask material layer 182 and a photoresist mask pattern 190p may be sequentially formed on the sacrificial layer 110s and the insulating layer 110m that are alternately laminated.

The hard mask material layer 182 may be an amorphous carbon layer (ACL), a spin-on hardmask (SOH), and other carbon-based materials having an appropriate etch selectivity with respect to the sacrificial layer 110s and the insulating layer 110m.

The photoresist mask pattern 190p may include a resist for extreme ultraviolet (EUV) (13.5 nm), a resist for a KrF excimer laser (248 nm), a resist for an ArF excimer laser (193 nm), or a resist for an F2 excimer laser (157 nm). The photoresist pattern 190p may include a plurality of hole patterns 194 corresponding to channel holes (see 130h of FIG. 3) to be formed in a memory cell area.

Figure 3B:
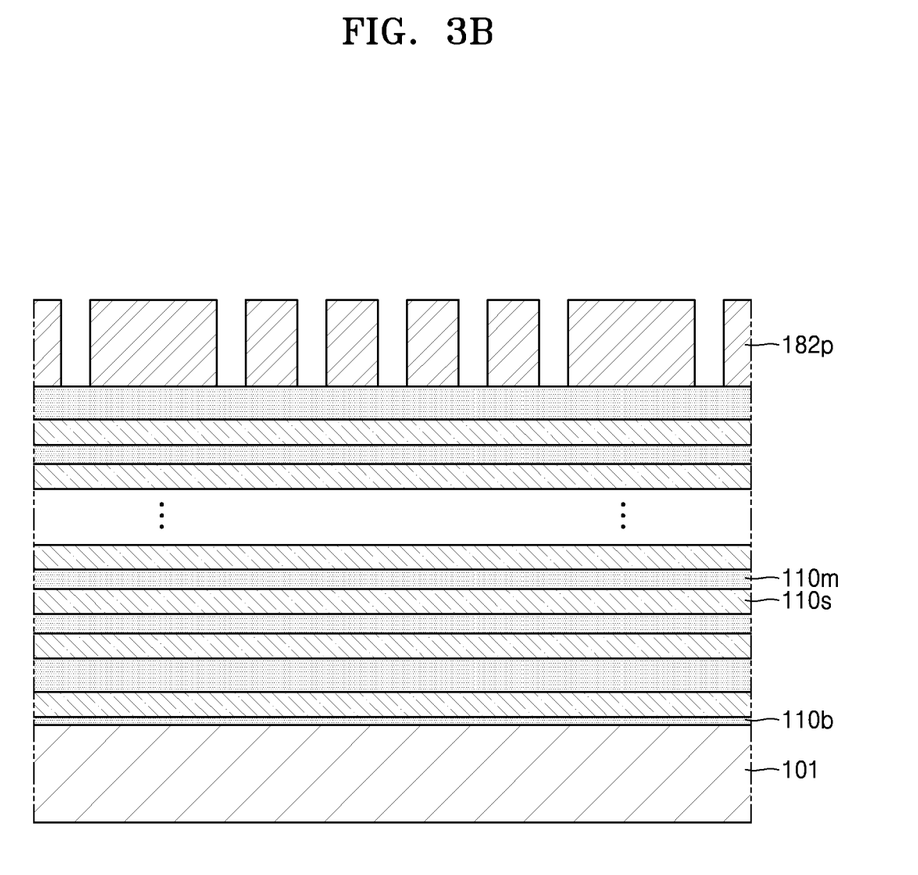

Referring to FIGS. 2 and 3B, a hard mask pattern 182p may be formed by etching the hard mask material layer (see 182 of FIG. 3A) by using the photoresist mask pattern (see 190p of FIG. 3A) as an etching mask (S200). The etching may be dry anisotropic etching.

In a portion of the hard mask material layer 182 exposed by the hole patterns 194 of the photoresist mask pattern 190p, the top surface of the insulating layer 110m may be exposed because the hard mask material layer 182 is removed by the etching process.

Because the hard mask material layer 182 is protected by a portion where the photoresist mask pattern 190p exists, the hard mask material layer 182 may remain without being etched.

FIGS. 3A and 3B illustrate that the hard mask material layer 182 and the photoresist mask pattern 190p are sequentially formed on the sacrificial layer 110s and insulating layer 110m, which are alternately laminated, and the hard mask pattern 182p is formed by etching the hard mask material layer 182 by using the photoresist mask pattern 190p as an etching mask, but the disclosure is not limited thereto. For example, only one of the hard mask pattern 182p or the photoresist mask pattern 190p may be formed on the sacrificial layer 110s and the insulating layer 110m, which are alternately laminated, and one of the formed hard mask pattern 182p or the formed photoresist mask pattern 190p may be directly used as an etching mask to etch the sacrificial layer 110s and the insulating layer 110m.

Figure 3C:
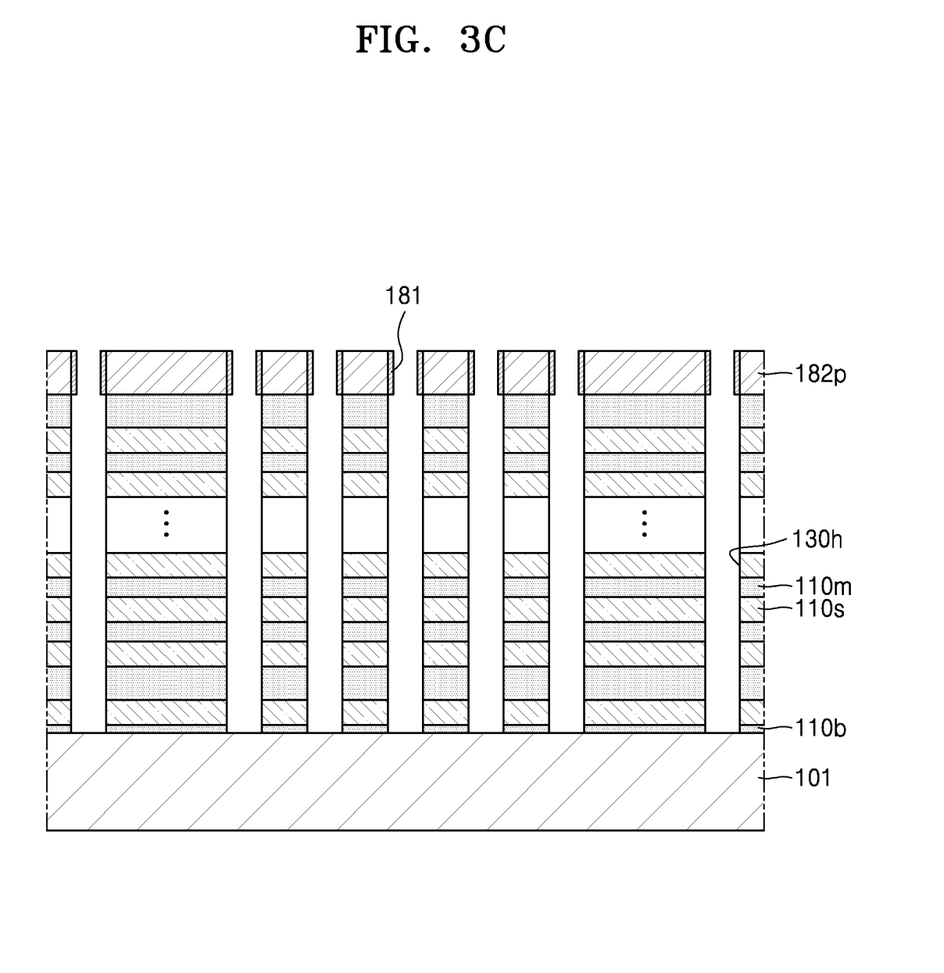

Referring to FIGS. 2 and 3C, channel holes 130h passing through the sacrificial layer 110s and the insulating layer 110m may be formed by using the hard mask pattern 182p as an etching mask (S300).

In order to form the channel holes 130h passing through the sacrificial layer 110s and the insulating layer 110m, power may be supplied and an electrical bias may be applied, while supplying the etching gas composition and oxygen. The etching gas composition may be changed to a plasma state by the supplied power, and anisotropic etching may be performed by the electrical bias. The etching gas composition may be an etching gas composition according to the embodiment described above. As the etching process is performed by using the etching gas composition, pattern hole distortion caused by the etching process may be improved and the profile of the pattern may be improved because the CD of the pattern line is reduced.

In an embodiment, an etching equipment using plasma may be an ICP equipment or a CCP equipment. However, the disclosure is not limited thereto. For example, the etching equipment may be an RIE equipment, an MERIE equipment, a TCP equipment, a hollow anode type plasma equipment, a helical resonator plasma equipment, an ECR plasma equipment, or the like.

The etching gas composition in the plasma state may form a passivation layer 181 on the side surface of the hard mask pattern 182p while anisotropic etching is performed. The passivation layer 181 may include a fluorocarbon-based polymer including C—C, C—F, and C—H bonds. The passivation layer 181 may increase the selectivity of the layer to be etched and may improve line-edge roughness (LER) and line-width roughness (LWR) of the etching mask, such as ACL, SOH, and PR. Accordingly, it is possible to form a high aspect ratio contact (HARC) with excellent quality in which bowing or tapering is reduced.

In an embodiment, the anisotropic etching may be performed at a temperature of about 250 K to about 420 K, a temperature of about 260 K to about 400 K, a temperature of about 270 K to about 380 K, a temperature of about 280 K to about 360 K, or a temperature of about 290 K to about 340 K.

Figure 3D:
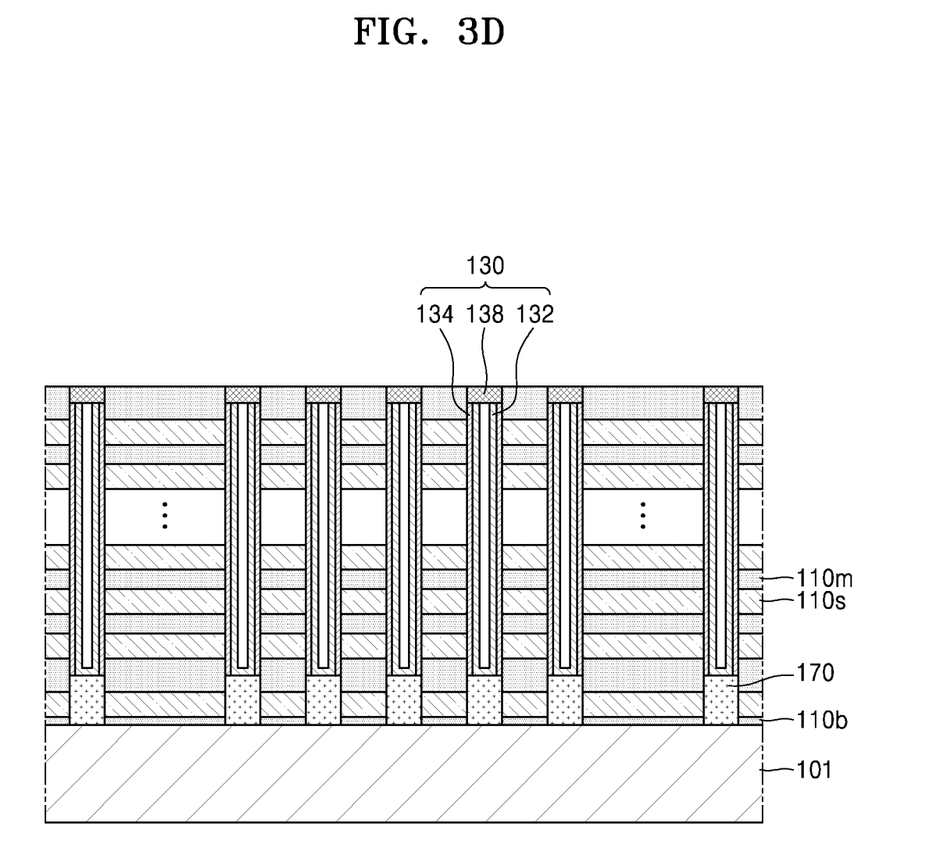

Referring to FIGS. 2 and 3D, a semiconductor pattern 170 may be formed to a certain height in the channel hole 130h.

The semiconductor pattern 170 may be formed by selective epitaxial growth (SEG) using the exposed top surface of the substrate 101 as a seed. Accordingly, the semiconductor pattern 170 may be formed to include single crystalline silicon according to the material of the substrate 101 and may be doped with impurities as necessary. In an embodiment, the semiconductor pattern 170 may be formed by forming an amorphous silicon layer to fill the channel hole 130h at a certain height and performing laser epitaxial growth (LEG) or solid phase epitaxy (SPE) on the amorphous silicon layer.

Vertical channel structures 130 may be respectively formed in the channel holes 130h.

The vertical channel structure 130 may include an information storage pattern 134, a vertical channel pattern 132, and a filling insulating pattern 138. The information storage pattern 134 may be between the sacrificial layer 110s and the vertical channel pattern 132. In embodiments, the information storage pattern 134 may be provided in a form of a tube having openings at upper and lower portions. The information storage pattern 134 may be provided so that the top surface of the semiconductor pattern 170 is exposed. In embodiments, the information storage pattern 134 may include a layer capable of storing data by using a Fowler-Nordheim tunneling effect. In embodiments, the information storage pattern 134 may include a thin film capable of storing data based on different operating principles.

In embodiments, the information storage pattern 134 may include a plurality of thin films. For example, the information storage pattern 134 may include a plurality of thin films, such as a blocking insulating layer, a charge storage layer, and a tunnel insulating layer.

The vertical channel pattern 132 may be formed to conformally cover the side surface of the information storage pattern 134 and the exposed top surface of the semiconductor pattern 170. The vertical channel pattern 132 may be directly connected to the semiconductor pattern 170. The vertical channel pattern 132 may include a semiconductor material (e.g., a polycrystalline silicon layer, a single crystalline silicon layer, or an amorphous silicon layer). In embodiments, the vertical channel pattern 132 may be formed by ALD or CVD.

The filling insulating pattern 138 may be formed to fill the remaining portion of the channel hole 130h which is not filled by the information storage pattern 134 and the vertical channel pattern 132. The filling insulating pattern 138 may include a silicon oxide layer or a silicon nitride layer. In embodiments, prior to forming the filling insulating pattern 138, a hydrogen annealing process may be further performed to cure crystal defects that may exist in the vertical channel pattern 132.

Figure 3E:
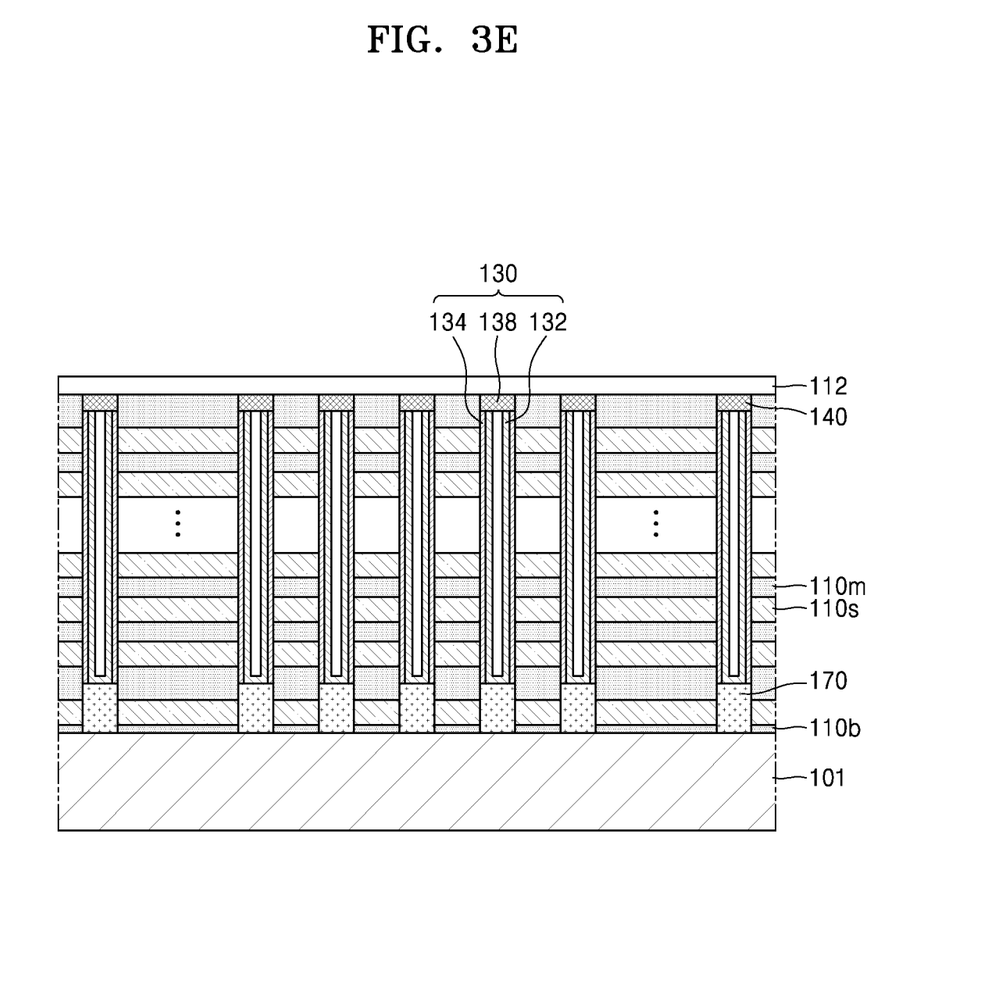

Referring to FIGS. 2 and 3E, conductive pads 140 may be respectively formed on the vertical channel structures 130.

In embodiments, in order to form the conductive pad 140, the upper portion of the vertical channel structure 130 may be recessed and a conductive material may be buried in the recessed upper portion of the vertical channel structure 130. In embodiments, the conductive pad 140 may be formed by implanting impurities into the upper portion of the vertical channel structure 130.

A cap insulating layer 112 may be formed on the conductive pad 140 and the uppermost insulating layer 110m. The cap insulating layer 112 may be a silicon oxide layer, a silicon nitride layer, or the like, and may be formed by CVD or ALD.

Figure 3F:
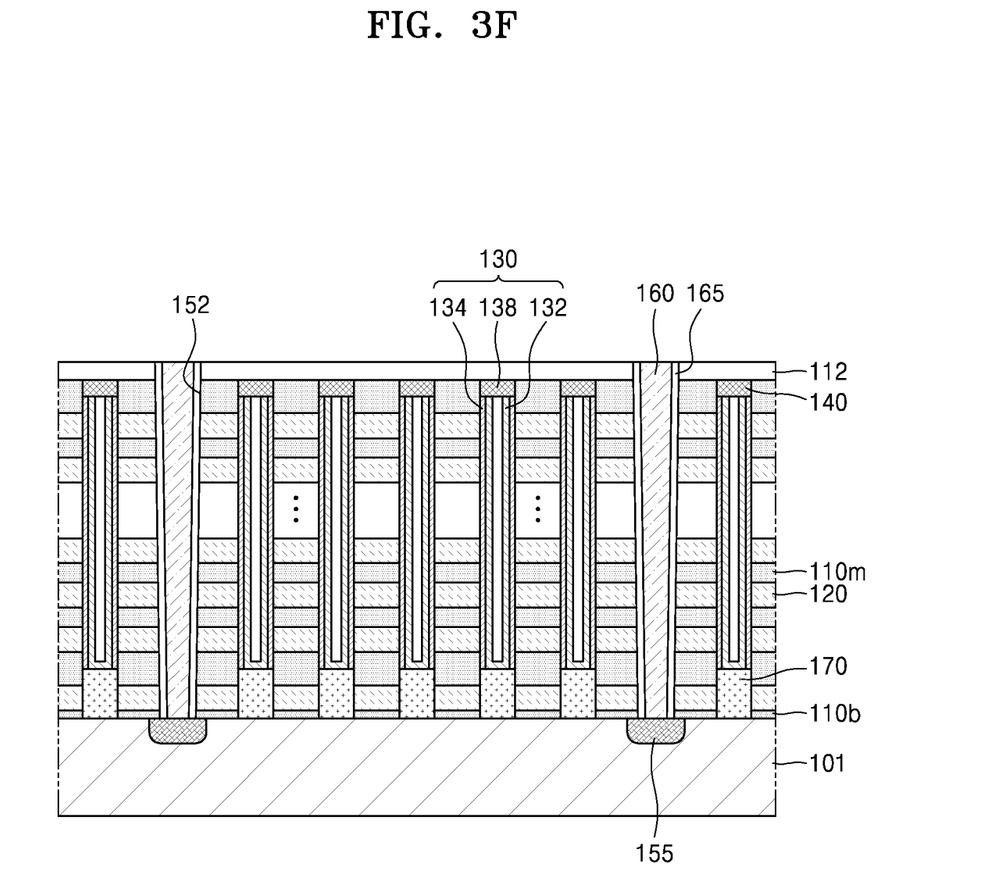

Referring to FIGS. 2 and 3F, a word line cut trench 152 extending up to the top surface of the substrate 101 may be formed in a portion of the memory cell area, and a common source line 155 may be formed by implanting impurities into the substrate 101 through the word line cut trench 152. The impurities may have a conductivity type opposite to that of the well or the substrate 101 in which the common source line 155 is formed.

The sacrificial layer 110s may be replaced with a gate electrode through the word line cut trench 152.

To this end, the sacrificial layer 110s may be removed through the word line cut trench 152. As described above with reference to FIGS. 2 and 3A, because the sacrificial layer 110s is selected to have a high etch selectivity with respect to the insulating layer 110m, the sacrificial layer 110s may be selectively removed by selecting an appropriate etchant.

A barrier layer (not shown) and a gate electrode material layer may be sequentially formed to fill the space from which the sacrificial layer 110s is removed. The barrier layer may include TiN or TaN and may be formed by CVD or ALD to have a thickness of about 30 angstroms to about 150 angstroms.

The gate electrode material layer may include metal (e.g., tungsten (W), copper (Cu), aluminum (Al), platinum (Pt), titanium (Ti), or tantalum (Ta)), conductive metal nitride (e.g., metal silicide, titanium nitride (TiN), or tantalum nitride (TaN)), polysilicon, or amorphous silicon, and may be doped with impurities as necessary. The gate electrode material layer may be formed to fill the space remaining after the barrier layer is formed. A gate electrode 120 may be formed by patterning the gate electrode material layer in the word line cut trench.

An isolation insulating layer 165 and a conductive layer 160 may be sequentially formed in the word line cut trench 152.

The isolation insulating layer 165 may include one of a silicon nitride layer, a silicon oxide layer, or a silicon oxynitride layer, and may be formed by CVD or ALD. The conductive layer 160 may include metal such as tungsten or copper, and may be formed by CVD or ALD.

Hereinafter, the configuration and effects of the disclosure are described in more detail with specific experimental examples and comparative examples, but such experimental examples are only intended to more clearly understand the disclosure and are not intended to limit the scope of the disclosure.

Examples 1 to 6 and Comparative Examples 1 to 9

The etch rate for each layer to be etched and the difference in diameter of the channel hole formed in each layer to be etched were measured under the conditions of Table 1 by using the etching gas composition having the composition shown in Table 1 below, and results thereof are summarized in Table 2. The difference in diameter of the channel hole formed in each layer to be etched was measured through the difference between the maximum diameter and the minimum diameter of each channel hole formed by using the etching gas composition having the composition shown in Table 1 below.

TABLE 1

|  | 1,1,1,3,3,3-hexafluoro-propane | 1,1,1,2,3,3-hexafluoro-propane | 1,1,2,2,3,3-hexafluoro-propane | Ar | $O_2$ | Power | T | Time |
|---|---|---|---|---|---|---|---|---|
|  | sccm | | | | | W | K | sec |
| Example 1 | 25 | 25 | 0 | 150 | 20 | 400 | 293 | 60 |
| Example 2 | 30 | 20 | 0 | 150 | 20 | 400 | 293 | 60 |
| Example 3 | 25 | 0 | 25 | 150 | 20 | 400 | 293 | 60 |
| Example 4 | 30 | 0 | 20 | 150 | 20 | 400 | 293 | 60 |
| Example 5 | 0 | 25 | 25 | 150 | 20 | 400 | 293 | 60 |
| Example 6 | 0 | 20 | 30 | 150 | 20 | 400 | 293 | 60 |
| Comparative Example 1 | 50 | 0 | 0 | 150 | 20 | 400 | 293 | 60 |
| Comparative Example 2 | 50 | 0 | 0 | 150 | 30 | 400 | 293 | 60 |
| Comparative Example 3 | 50 | 0 | 0 | 150 | 40 | 400 | 293 | 60 |
| Comparative Example 4 | 0 | 50 | 0 | 150 | 20 | 400 | 293 | 60 |
| Comparative Example 5 | 0 | 50 | 0 | 150 | 30 | 400 | 293 | 60 |
| Comparative Example 6 | 0 | 50 | 0 | 150 | 40 | 400 | 293 | 60 |
| Comparative Example 7 | 0 | 0 | 50 | 150 | 20 | 400 | 293 | 60 |
| Comparative Example 8 | 0 | 0 | 50 | 150 | 30 | 400 | 293 | 60 |
| Comparative Example 9 | 0 | 0 | 50 | 150 | 40 | 400 | 293 | 60 |

TABLE 2

|  | $SiO_2$ | $Si_3N_4$ | Selectivity | | Contact Hole Diameter Difference |
|---|---|---|---|---|---|
|  | nm/min | | $SiO_2$/ACL | $Si_3N_4$/ACL | Nm |
| Example 1 | 163.09 | 148.17 | 8.3 | 7.51 | 55 |
| Example 2 | 170.38 | 150.29 | 7.54 | 6.88 | 58.31 |
| Example 3 | 125.14 | 113.67 | 9.29 | 8.37 | 27.33 |
| Example 4 | 130.43 | 116.45 | 8.75 | 7.87 | 29.47 |
| Example 5 | 112.32 | 102.14 | 12.95 | 11.82 | 25 |
| Example 6 | 110.28 | 100.27 | 14.27 | 12.75 | 23.5 |
| Comparative Example 1 | 165.48 | 150.31 | 5.15 | 4.82 | 66.87 |
| Comparative Example 2 | 171.39 | 155.87 | 4.01 | 3.92 | 75.98 |
| Comparative Example 3 | 180.43 | 162.09 | 2.87 | 2.75 | 88.13 |
| Comparative Example 4 | 145.83 | 132.08 | 9.03 | 8.14 | 28.33 |
| Comparative Example 5 | 151.98 | 136.23 | 7.67 | 6.82 | 34.87 |
| Comparative Example 6 | 160.54 | 142.76 | 6.35 | 5.51 | 41.29 |
| Comparative Example 7 | 99.87 | 91.12 | 16.12 | 14.52 | 22.71 |
| Comparative Example 8 | 105.98 | 96.67 | 13.47 | 12.29 | 33.56 |
| Comparative Example 9 | 111.27 | 101.86 | 12.01 | 10.74 | 42.01 |

As shown in Table 2, in the case of Comparative Examples 1 to 9, it was confirmed that the etch rate increased as the amount of oxygen supplied increased, but at the same time, the selectivity rapidly deteriorated.

On the other hand, in the case of Examples 1 to 6, as described above, it was confirmed that the etch rate and the etch selectivity could be controlled by adjusting the amount of each of the organic fluorine compounds without adjusting the amount of oxygen supplied, and the selectivity was maintained relatively high while the etch rate increased according to the change in the amount of each of the organic fluorine compounds included in the etching gas composition.

Therefore, in etching the layer to be etched having a high aspect ratio, it was confirmed that it was advantageous to use the etching gas compositions of Examples 1 to 6.

Examples 7 to 12 and Comparative Examples 10 to 18

The etch rate for each layer to be etched and the difference in diameter of the channel hole formed in each layer to be etched were measured under the conditions of Table 3 by using the etching gas composition having the composition shown in Table 3 below, and results thereof are summarized in Table 4. The difference in diameter of the channel hole formed in the layer to be etched was measured in the same manner as described above.

TABLE 3

|  | Hexafluoro-isobutene | (2Z)-1,1,1,4,4,4-hexafluoro-2-butene | (3R, 4S)-1,1,2,2,3,4-hexafluoro-cyclobutane | Ar | $O_2$ | Power | T | Time |
|---|---|---|---|---|---|---|---|---|
|  | sccm | | | | | W | K | sec |
| Example 7 | 25 | 25 | 0 | 150 | 80 | 400 | 293 | 60 |
| Example 8 | 30 | 20 | 0 | 150 | 80 | 400 | 293 | 60 |
| Example 9 | 25 | 0 | 25 | 150 | 80 | 400 | 293 | 60 |
| Example 10 | 30 | 0 | 20 | 150 | 80 | 400 | 293 | 60 |

TABLE 3-continued

|  | Hexafluoro-isobutene | (2Z)-1,1,1,4,4,4-hexafluoro-2-butene | (3R, 4S)-1,1,2,2,3,4-hexafluoro-cyclobutane | Ar | $O_2$ | Power W | T K | Time sec |
|---|---|---|---|---|---|---|---|---|
|  |  | sccm |  |  |  |  |  |  |
| Example 11 | 0 | 25 | 25 | 150 | 80 | 400 | 293 | 60 |
| Example 12 | 0 | 20 | 30 | 150 | 80 | 400 | 293 | 60 |
| Comparative Example 10 | 50 | 0 | 0 | 150 | 70 | 400 | 293 | 60 |
| Comparative Example 11 | 50 | 0 | 0 | 150 | 75 | 400 | 293 | 60 |
| Comparative Example 12 | 50 | 0 | 0 | 150 | 80 | 400 | 293 | 60 |
| Comparative Example 13 | 0 | 50 | 0 | 150 | 70 | 400 | 293 | 60 |
| Comparative Example 14 | 0 | 50 | 0 | 150 | 75 | 400 | 293 | 60 |
| Comparative Example 15 | 0 | 50 | 0 | 150 | 80 | 400 | 293 | 60 |
| Comparative Example 16 | 0 | 0 | 50 | 150 | 70 | 400 | 293 | 60 |
| Comparative Example 17 | 0 | 0 | 50 | 150 | 75 | 400 | 293 | 60 |
| Comparative Example 18 | 0 | 0 | 50 | 150 | 80 | 400 | 293 | 60 |

TABLE 4

|  | $SiO_2$ | $Si_3N_4$ | Selectivity | | Contact Hole Diameter Difference |
|---|---|---|---|---|---|
|  | nm/min | | $SiO_2$/ACL | $Si_3N_4$/ACL | nm |
| Example 7 | 231.67 | 208.1 | 10.12 | 9.28 | 71.09 |
| Example 8 | 242.13 | 218.52 | 9.37 | 8.65 | 80.37 |
| Example 9 | 190.2 | 172.12 | 11.56 | 10.47 | 62.12 |
| Example 10 | 197.09 | 179.18 | 11.08 | 10.05 | 70.19 |
| Example 11 | 186.98 | 168.21 | 12.11 | 10.86 | 67.85 |
| Example 12 | 179.03 | 161.59 | 12.86 | 11.57 | 75.31 |
| Comparative Example 10 | 207.66 | 189.17 | 13.28 | 9.92 | 80.78 |
| Comparative Example 11 | 226.17 | 209.15 | 11.41 | 9.33 | 88.1 |
| Comparative Example 12 | 239.33 | 213.78 | 9.61 | 8.65 | 98.49 |
| Comparative Example 13 | 177.76 | 161.39 | 15.89 | 14.29 | 70.56 |
| Comparative Example 14 | 194.08 | 176.08 | 13.48 | 12.17 | 78.09 |
| Comparative Example 15 | 214.39 | 201.98 | 11.27 | 10.31 | 86.67 |
| Comparative Example 16 | 157.2 | 143.07 | 17.02 | 15.47 | 59.87 |
| Comparative Example 17 | 170.28 | 163.54 | 14.56 | 13.1 | 66.54 |
| Comparative Example 18 | 186.93 | 175.11 | 12.2 | 11.07 | 73.33 |

As shown in Table 4, in the case of Comparative Examples 10 to 18, it was confirmed that the etch rate increased as the amount of oxygen supplied increased, but at the same time, the selectivity rapidly deteriorated.

On the other hand, in the case of Examples 7 to 12, as described above, it was confirmed that the etch rate and the etch selectivity could be controlled by adjusting the amount of each of the organic fluorine compounds without adjusting the amount of oxygen supplied, and the selectivity was maintained relatively high while the etch rate increased according to the change in the amount of each of the organic fluorine compounds included in the etching gas composition.

Therefore, in etching the layer to be etched having a high aspect ratio, it was confirmed that it was advantageous to use the etching gas compositions of Examples 7 to 12.

Examples 13 to 15 and Comparative Examples 19 to 22

The degree of hole distortion was measured under the conditions of Table 5 by using the etching gas composition having the composition shown in Table 5 below, and results thereof are summarized in Table 6. The degree of hole distortion was measured through the major axis/minor axis ratio of the bottom shape of the pattern formed by the etching process.

TABLE 5

|  | Hexafluoro-isobutene | (2Z)-1,1,1,4,4,4-hexafluoro-2-butene | (3R, 4S)-1,1,2,2,3,4-hexafluoro-cyclobutane | Ar | $NbF_5$ | $WF_6$ | $O_2$ | Power W | T K | Time sec |
|---|---|---|---|---|---|---|---|---|---|---|
|  |  | | sccm | | | | | | | |
| Example 13 | 25 | 0 | 25 | 150 | 3 | 0 | 20 | 400 | 293 | 60 |
| Example 14 | 25 | 0 | 25 | 150 | 5 | 0 | 20 | 400 | 293 | 60 |
| Example 15 | 25 | 0 | 25 | 150 | 10 | 0 | 20 | 400 | 293 | 60 |
| Comparative Example 19 | 25 | 0 | 25 | 150 | 0 | 0 | 20 | 400 | 293 | 60 |
| Comparative Example 20 | 25 | 0 | 25 | 150 | 0 | 3 | 20 | 400 | 293 | 60 |

TABLE 5-continued

| | Hexafluoro-isobutene | (2Z)-1,1,1,4,4,4-hexafluoro-2-butene | (3R, 4S)-1,1,2,2,3,4-hexafluoro-cyclobutane sccm | Ar | NbF$_5$ | WF$_6$ | O$_2$ | Power W | T K | Time sec |
|---|---|---|---|---|---|---|---|---|---|---|
| Comparative Example 21 | 25 | 0 | 25 | 150 | 0 | 5 | 20 | 400 | 293 | 60 |
| Comparative Example 22 | 25 | 0 | 25 | 150 | 0 | 10 | 20 | 400 | 293 | 60 |

TABLE 6

| | Hole distortion (major axis/minor axis) |
|---|---|
| Example 13 | 1.41 |
| Example 14 | 1.3 |
| Example 15 | 1.16 |
| Comparative Example 19 | 2.72 |
| Comparative Example 20 | 1.89 |
| Comparative Example 21 | 1.74 |
| Comparative Example 22 | 1.59 |

As shown in Table 6, it was confirmed that Comparative Example 19 had a relatively high degree of hole distortion.

It was confirmed that in the case of Comparative Examples 20 to 22, WF$_6$ was included, and thus, the degree of hole distortion was improved to some extent, but in the case of Examples 13 to 15, NbF$_5$ was included, and thus, the degree of hole distortion was remarkably improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. An etching gas composition comprising:
   at least two C$_3$ or C$_4$ organic fluorine compounds; and niobium fluoride,
   wherein the at least two C$_3$ or C$_4$ organic fluorine compounds are isomers, and wherein the niobium fluoride is included in an amount of about 1 part by volume to about 5 parts by volume based on 100 parts by volume of the etching gas composition.

2. The etching gas composition of claim 1, wherein at least two C$_3$ or C$_4$ organic fluorine compounds each have a formula of C$_3$H$_2$F$_6$.

3. The etching gas composition of claim 1, wherein the niobium fluoride has a formula of NbF$_5$.

4. The etching gas composition of claim 1, wherein the at least two C$_3$ or C$_4$ organic fluorine compounds each have a formula of C$_4$H$_2$F$_6$.

5. The etching gas composition of claim 1, further comprising an inert gas and a reactive gas,
   wherein the inert gas is selected from among argon (Ar), helium (He), neon (Ne), and any mixture thereof.

6. The etching gas composition of claim 5, wherein the reactive gas is oxygen gas (O$_2$).

7. The etching gas composition of claim 1, wherein the at least two C$_3$ or C$_4$ organic fluorine compounds are selected from among 1,1,1,3,3,3-hexafluoropropane, 1,1,1,2,3,3-hexafluoropropane, and 1,1,2,2,3,3-hexafluoropropane.

8. The etching gas composition of claim 7, wherein the at least two C$_3$ or C$_4$ organic fluorine compounds comprise a first organic fluorine compound and a second organic fluorine compound,
   the first organic fluorine compound is 1,1,1,2,3,3-hexafluoropropane, and
   the second organic fluorine compound is selected from among 1,1,1,3,3,3-hexafluoropropane and 1,1,2,2,3,3-hexafluoropropane.

9. The etching gas composition of claim 7, wherein the at least two C$_3$ or C$_4$ organic fluorine compounds comprise a first organic fluorine compound and a second organic fluorine compound,
   the first organic fluorine compound is 1,1,1,3,3,3-hexafluoropropane, and
   the second organic fluorine compound is 1,1,2,2,3,3-hexafluoropropane.

10. The etching gas composition of claim 1, wherein the at least two C$_3$ or C$_4$ organic fluorine compounds are selected from among hexafluoroisobutene, (2Z)-1,1,1,4,4,4-hexafluoro-2-butene, 2,3,3,4,4,4-hexafluoro-1-butene, (2Z)-1,1,1,2,4,4-hexafluoro-2-butene, (2Z)-1,1,2,3,4,4-hexafluoro-2-butene, 1,1,2,3,4,4-hexafluoro-2-butene, (3R, 4S)-1,1,2,2,3,4-hexafluorocyclobutane, and 1,1,2,2,3,3-hexafluorocyclobutane.

11. The etching gas composition of claim 10, wherein the at least two C$_3$ or C$_4$ organic fluorine compounds are a first organic fluorine compound and a second organic fluorine compound and the etching gas composition further comprises a third organic fluorine compound and a fourth organic fluorine compound,
   the third organic fluorine compound is (2Z)-1,1,1,4,4,4-hexafluoro-2-butene, and
   the fourth organic fluorine compound is selected from among hexafluoroisobutene and (3R, 4S)-1,1,2,2,3,4-hexafluorocyclobutane.

12. The etching gas composition of claim 10, wherein the at least two C$_3$ or C$_4$ organic fluorine compounds are a first organic fluorine compound and a second organic fluorine compound and the etching gas composition further comprises a third organic fluorine compound and a fourth organic fluorine compound,
   the third organic fluorine compound is hexafluoroisobutene, and
   the fourth organic fluorine compound is (3R, 4S)-1,1,2,2,3,4-hexafluorocyclobutane.

13. A substrate processing apparatus comprising:
a chamber having a processing space in which substrate processing is performed;
a gas supply device configured to supply an etching gas composition to the processing space; and
a substrate support device disposed in the processing space and configured to support a substrate,
wherein the etching gas composition comprises at least two $C_3$ or $C_4$ organic fluorine compounds and niobium fluoride, and
the at least two $C_3$ or $C_4$ organic fluorine compounds are isomers, and wherein the niobium fluoride is included in an amount of about 1 part by volume to about 5 parts by volume based on 100 parts by volume of the etching gas composition.

14. The substrate processing apparatus of claim 13, further comprising a shower head disposed above the substrate and having a plurality of gas supply holes.

15. A pattern forming method comprising:
forming a layer to be etched on a substrate;
forming an etching mask on the layer to be etched;
etching the layer to be etched through the etching mask by using plasma obtained from an etching gas composition; and
removing the etching mask,
wherein the etching gas composition comprises at least two $C_3$ or $C_4$ organic fluorine compounds and niobium fluoride, and
the at least two $C_3$ or $C_4$ organic fluorine compounds are isomers, and wherein the niobium fluoride is included in an amount of about 1 part by volume to about 5 parts by volume based on 100 parts by volume of the etching gas composition.

16. The pattern forming method of claim 15, wherein the etching mask is at least one selected from among a photoresist (PR), a spin-on hardmask (SOH), and an amorphous carbon layer (ACL).

17. The pattern forming method of claim 15, wherein the layer to be etched comprises at least one of silicon nitride or silicon oxide.

18. The pattern forming method of claim 15, wherein a plasma source for obtaining the plasma is one of an inductively coupled plasma (ICP) or a capacitively coupled plasma (CCP).

* * * * *